(12) United States Patent
Fan

(10) Patent No.: US 11,942,584 B2
(45) Date of Patent: Mar. 26, 2024

(54) MICRO DISPLAY PANEL, MANUFACTURING METHOD THEREOF, AND SPLICED DISPLAY PANEL

(71) Applicant: Shenzhen China Star Optoelectronics Semiconductor Display Technology Co., Ltd., Guangdong (CN)

(72) Inventor: Yong Fan, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 642 days.

(21) Appl. No.: 17/252,806

(22) PCT Filed: Apr. 7, 2020

(86) PCT No.: PCT/CN2020/083524
§ 371 (c)(1),
(2) Date: Dec. 16, 2020

(87) PCT Pub. No.: WO2021/184446
PCT Pub. Date: Sep. 23, 2021

(65) Prior Publication Data
US 2022/0052239 A1 Feb. 17, 2022

(30) Foreign Application Priority Data
Mar. 20, 2020 (CN) .......................... 202010202337.6

(51) Int. Cl.
*H01L 33/62* (2010.01)
*G09F 9/33* (2006.01)
(Continued)

(52) U.S. Cl.
CPC ................ *H01L 33/62* (2013.01); *G09F 9/33* (2013.01); *H01L 27/156* (2013.01); *H01L 2933/0066* (2013.01)

(58) Field of Classification Search
CPC .................. H01L 33/62; H01L 27/156; H01L 2933/0066; H01L 25/0753; H01L 25/167; H01L 33/48; H01L 2933/0033; G09F 9/33
See application file for complete search history.

(56) References Cited

U.S. PATENT DOCUMENTS

2016/0268352 A1* 9/2016 Hong ..................... H10K 59/88
2019/0311256 A1 10/2019 Hack
(Continued)

FOREIGN PATENT DOCUMENTS

CN 106252380 12/2016
CN 110379322 10/2019
(Continued)

*Primary Examiner* — Herve-Louis Y Assouman

(57) ABSTRACT

In the embodiments of the present invention, a glass substrate in a micro display panel includes a first surface and a second surface arranged opposite to one another, and a first terminal and a second terminal arranged opposite to one another. An insulation layer disposed on the first surface. A thin film transistor layer disposed on a surface of the insulation layer away from the glass substrate. A micro light-emitting diode layer disposed on a surface of the thin film transistor layer away from the insulation layer. A terminal of the insulation layer, the thin film transistor layer, and the micro light-emitting diode layer close to the first terminal is bent toward a side away from the second surface, and an interval is defined between a terminal of the insulation layer close to the first terminal and the first terminal.

15 Claims, 4 Drawing Sheets

(51) Int. Cl.
*H01L 25/075* (2006.01)
*H01L 25/16* (2023.01)
*H01L 27/15* (2006.01)
*H01L 33/48* (2010.01)

(56) References Cited

U.S. PATENT DOCUMENTS

2019/0371879 A1    12/2019  Li
2020/0211941 A1*  7/2020  Xi ................... H01L 23/49811

FOREIGN PATENT DOCUMENTS

CN       110503898      11/2019
CN       108766988       8/2021

* cited by examiner

MICRO DISPLAY PANEL, MANUFACTURING METHOD THEREOF, AND SPLICED DISPLAY PANEL

RELATED APPLICATIONS

This application is a National Phase of PCT Patent Application No. PCT/CN2020/083524 having International filing date of Apr. 7, 2020, which claims the benefit of priority of Chinese Patent Application No. 202010202337.6 filed on Mar. 20, 2020. The contents of the above applications are all incorporated by reference as if fully set forth herein in their entirety.

FIELD AND BACKGROUND OF THE INVENTION

The present disclosure relates to the field of display technology, and more particularly, to a micro display panel, a manufacturing method thereof, and a spliced display panel.

BACKGROUND OF INVENTION

Mini/micro-light emitting diode (mini/micro-LED) display as a next-generation display technology, has an excellent display effect, strong color reproducibility, wide-viewing angles, high refresh rate, high contrast, high stability, low power consumption, high grayscale, etc., are better than performance of liquid crystal displays (LCDs) and organic light-emitting diodes (OLEDs). In the long run, with breakthrough of key technologies such as transfer, mini/micro-LED may be applied in various display fields from small screens to large screens.

In current top-emitting flexible mini/micro-LED splicing technology solutions, because a fan-out region is bent to a glass side, and the cut glass cross-section is rough, problems, such as spikes may occur, and an insulation layer may be damaged during a bending process.

Thus, a spliced display panel that is not easy to damage the insulation layer during the bending process has become a technical problem to be urgently solved by those skilled in the art.

SUMMARY OF THE INVENTION

The present disclosure provides a micro display panel, a manufacturing method thereof, and a spliced display panel to solve the technical problem that an insulation layer is easily damaged during a bending process.

An embodiment of the present disclosure provides a micro display panel. The micro display panel comprises a glass substrate, the glass substrate comprises a first surface and a second surface arranged opposite to one another, and a first terminal and a second terminal arranged opposite to one another. An insulation layer is disposed on the first surface. A thin film transistor layer is disposed on a surface of the insulation layer away from the glass substrate. A micro light-emitting diode layer is disposed on a surface of the thin film transistor layer away from the insulation layer.

In some embodiments, the micro display panel further comprise a package layer, and a part of the package layer covers a surface of the thin film transistor away from the insulation layer.

In some embodiments, a terminal of the package layer close to the first terminal is flush with the first terminal, and a terminal of the package layer away from the first terminal extends to an outside of the second terminal.

In some embodiments, the micro display panel further comprise a protection adhesive layer, and the protection adhesive layer is disposed on a surface of the package layer away from the insulation layer.

In some embodiments, a terminal of the protection adhesive layer close to the first terminal is flush with the first terminal, and a terminal of the protection adhesive layer away from the first terminal is flush with a terminal of the insulation layer away from the second terminal.

In some embodiments, the micro display panel further comprise an integrated circuit module, and the integrated circuit module is disposed on the package layer.

In some embodiments, the micro display panel further comprise a printed circuit board, and the printed circuit board is connected to a terminal of the package layer away from the second terminal.

The embodiment of the present disclosure provides a manufacturing method of a micro display panel comprising following steps: providing a glass substrate, wherein the glass substrate comprises a first surface and a second surface arranged opposite to one another, and a first terminal and a second terminal arranged opposite to one another; forming an insulation layer on the first surface; forming a thin film transistor layer on a surface of the insulation layer away from the glass substrate; forming a micro light-emitting diode layer on a surface of the thin film transistor layer away from the insulation layer; and bending a terminal of the insulation layer, the thin film transistor layer, and the micro light-emitting diode layer close to the first terminal toward a side away from the second surface, and defining an interval between a terminal of the insulation layer close to the first terminal and the first terminal.

In some embodiments, after forming the micro light-emitting diode layer on the surface of the thin film transistor layer away from the insulation layer, cutting a part of the first terminal of the glass substrate by a laser.

In some embodiments, after forming the thin film transistor layer on the surface of the insulation layer away from the glass substrate, covering a part of a surface of the thin film transistor away from the insulation layer with the package layer.

In some embodiments, the step of covering the part of the surface of the thin film transistor away from the insulation layer with the package layer comprises that a terminal of the package layer close to the first terminal is flush with the first terminal, and a terminal of the package layer away from the first terminal extends to an outside of the second terminal.

In some embodiments, after forming the insulation layer on the first surface, forming a surface of the package layer away from the insulation layer without a protection adhesive layer.

In some embodiments, after covering the part of the surface of the thin film transistor away from the insulation layer with the package layer, forming an integrated circuit module on the package layer.

The embodiment of the present disclosure provides a spliced display panel comprising a plurality of micro display panels. The plurality of the micro display panels are tightly spliced, and the micro display panels comprise a glass substrate, the glass substrate comprises a first surface and a second surface arranged opposite to one another, and a first terminal and a second terminal arranged opposite to one another. An insulation layer is disposed on the first surface. A thin film transistor layer is disposed on a surface of the insulation layer away from the glass substrate. A micro light-emitting diode layer is disposed on a surface of the thin film transistor layer away from the insulation layer.

In some embodiments, the micro display panel further comprise a package layer, and a part of the package layer covers a surface of the thin film transistor away from the insulation layer.

In some embodiments, a terminal of the package layer close to the first terminal is flush with the first terminal, and a terminal of the package layer away from the first terminal extends to an outside of the second terminal.

In some embodiments, the micro display panel further comprise a protection adhesive layer, and the protection adhesive layer is disposed on a surface of the package layer away from the insulation layer.

In some embodiments, a terminal of the protection adhesive layer close to the first terminal is flush with the first terminal, and a terminal of the protection adhesive layer away from the first terminal is flush with a terminal of the insulation layer away from the second terminal.

In some embodiments, the micro display panel further comprise an integrated circuit module, and the integrated circuit module is disposed on the package layer.

In some embodiments, the micro display panel further comprise a printed circuit board, and the printed circuit board is connected to a terminal of the package layer away from the second terminal.

The embodiment of the present disclosure provides a micro display panel, a manufacturing method thereof, and a spliced display panel. The micro display panel in the embodiment of the present disclosure comprises a glass substrate, an insulation layer, a thin film transistor layer, and a micro light-emitting diode layer. The glass substrate comprises a first surface and a second surface arranged opposite to one another, and a first terminal and a second terminal arranged opposite to one another. The insulation layer is disposed on the first surface. The thin film transistor layer is disposed on a surface of the insulation layer away from the glass substrate. The micro light-emitting diode layer is disposed on a surface of the thin film transistor layer away from the insulation layer. Wherein, a terminal of the insulation layer, the thin film transistor layer, and the micro light-emitting diode layer close to the first terminal is bent toward a side away from the second surface, and an interval is defined between a terminal of the insulation layer close to the first terminal and the first terminal. In the present disclosure, the micro light-emitting diode layer is disposed on the surface of the thin film transistor layer away from the insulation layer, so that bottom emission of the micro display panel can be realized. Since the terminal of the insulation layer, the thin film transistor layer, and the micro light-emitting diode layer close to the first terminal is fan-out bent toward the side away from the second surface, the interval is defined between the terminal of the insulation layer close to the first terminal and the first terminal. Therefore, when the micro display panel is spliced with the micro display panel, the insulating layer, the thin film transistor layer, and the micro light-emitting diode layer are not squeezed, which prevents the insulation layer from damage during a bending process. At the same time, a less interval occurs in adoption of such method a during an assembly process.

BRIEF DESCRIPTION OF THE SEVERAL VIEWS OF THE DRAWINGS

In order to explain technical solutions in embodiments of the present disclosure more clearly, drawings used in description of the embodiments will be briefly introduced below.

DESCRIPTION OF SPECIFIC EMBODIMENTS OF THE INVENTION

The technical solutions in the embodiments of the present disclosure will be clearly and completely described below in conjunction with accompanying drawings in the embodiments of the present disclosure. Obviously, the embodiments described are merely a part of the present disclosure, rather than all the embodiments. All other embodiments obtained by the person having ordinary skill in the art based on embodiments of the disclosure, without making creative efforts, are within the scope of the present disclosure.

The embodiment of the present disclosure provides a micro display panel, a manufacturing method thereof, and a spliced display panel. The micro display panel of the embodiment of the present disclosure is described in detail as follows.

Figure 1:
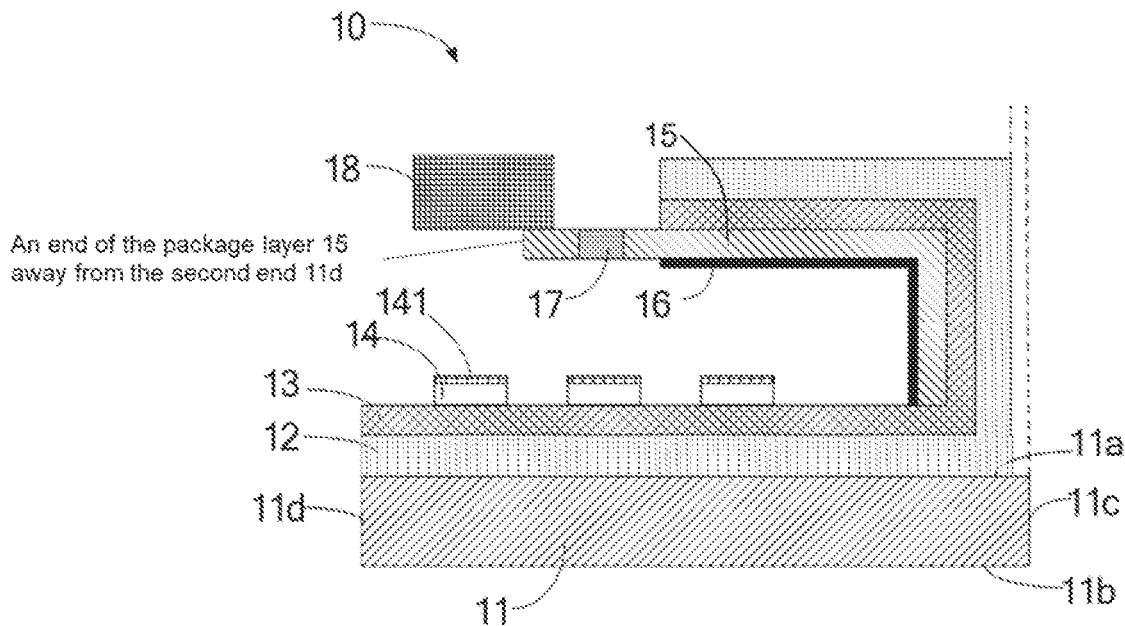
FIG. 1 is a schematic structural diagram of a micro display panel provided by an embodiment of the present disclosure.

Refer to FIG. 1, FIG. 1 is a schematic structural diagram of a micro display panel provided by an embodiment of the present disclosure. Wherein, the micro display panel 10 in the embodiment of the present disclosure comprises a glass substrate 11, an insulation layer 12, a thin film transistor layer 13, and a micro light-emitting diode layer 14. The glass substrate 11 comprises a first surface 11a and a second surface 11b arranged opposite to one another, and a first terminal 11c and a second terminal 11d arranged opposite to one another. The insulation layer 12 is disposed on the first surface 11a. The thin film transistor layer 13 is disposed on a surface of the insulation layer 12 away from the glass substrate 11. The micro light-emitting diode layer 14 is disposed on a surface of the thin film transistor layer 13 away from the insulation layer 12. Wherein, a terminal of the insulation layer 12, the thin film transistor layer 13, and the micro light-emitting diode layer close to the first terminal 11c is bent toward a side away from the second surface 11b, and an interval is defined between a terminal of the insulation layer 12 close to the first terminal 11c and the first terminal 11c.

It should be noted that the first surface 11a may be an upper surface of the glass substrate 11, and the second surface 11b may be a lower surface of the glass substrate 11. Moreover, the first surface 11a may be the lower surface of the glass substrate 11, and the second surface 11b may be the upper surface of the glass substrate 11. In the embodiment of the present disclosure without special instructions, the first surface 11a is assumed to be the upper surface of the glass substrate 11 and the second surface 11b is assumed to be the lower surface of the glass substrate 11. The first terminal 11c is a right terminal of the glass substrate 11 and the second terminal 11d is a left terminal of the glass substrate 11. Moreover, in some embodiments, orientations of the first terminal 11c and the second terminal 11d may be interchanged. In the embodiment of the present disclosure without special instructions, the first terminal 11c is assumed to be the right terminal of the glass substrate 11, and the second terminal 11d is assumed to be the left terminal of the glass substrate 11.

Moreover, the insulation layer 12 is a polyimide film, and the insulation layer 12 may be made of other materials. In the present embodiment, the materials used for the insulation layer 12 are not repeated.

Moreover, the thin film transistor layer 13 is a switch of the micro display panel. The thin film transistor drives each liquid crystal pixel on the micro display panel 10.

Moreover, the micro light-emitting diode layer comprises a plurality of micro light-emitting diodes. Specifically, the plurality of the micro light-emitting diodes can be arranged in an array to form a micro light-emitting diode layer.

Moreover, the interval is defined between the terminal of the insulation layer 12 close to the first terminal 11c and the first terminal 11c. Because of the interval, during a splicing process splicing the micro display panel 10 and the micro display panel 10, the insulation layer 12 in the micro display panel 10 will not rub against each other, thereby preventing the insulation layer 12 from breaking.

Wherein, the micro display panel 10 further comprise a package layer 15, and a part of the package layer 15 covers a surface of the thin film transistor away from the insulation layer 12.

It should be noted that the package layer 15 is disposed on a side close to the first terminal 11c, and the package layer 15 can be adhered to the thin film transistor layer 13 by glue. The package layer 15 is a flip-chip film. The package layer 15 is mainly used for packaging an integrated circuit module 17.

Wherein, a terminal of the package layer 15 close to the first terminal 11c is flush with the first terminal 11c, and a terminal of the package layer 15 away from the first terminal 11c extends to an outside of the second terminal 11d.

It should be noted that terminal of the package layer 15 away from the first terminal 11c extends to the outside of the second terminal 11d, which can be easily bent after the integrated circuit module 17 is packaged.

Wherein, the micro light-emitting diode layer 14 is disposed with a high reflectance package layer 141. Specifically, the high reflectance package layer 141 may be ultraviolet (UV) film.

Wherein, the micro display panel 10 further comprise a protection adhesive layer 16, and the protection adhesive layer 16 is disposed on a surface of the package layer 15 away from the insulation layer 12.

It should be noted that the protection adhesive layer 16 may be a black adhesive layer or a transparent adhesive layer. Moreover, the protection adhesive layer 16 may also be other adhesive layers. It can be understood that the protection adhesive layer 16 can protect the package layer 15 from being damaged by scratches, thereby increasing lifespan of the micro display panel 10.

Wherein, a terminal of the protection adhesive layer 16 close to the first terminal 11c is flush with the first terminal 11c, and a terminal of the protection adhesive layer 16 away from the first terminal 11c is flush with a terminal of the insulation layer 12 away from the second terminal 11d.

Since the terminal of the protection adhesive layer 16 close to the first terminal 11c is flush with the first terminal 11c, and the terminal of the protection adhesive layer 16 away from the first terminal 11c is flush with a terminal of the insulation layer 12 away from the second terminal 11d, a part of bent package layer 15 is protected. Therefore, materials will not be wasted while achieving protection purpose.

Wherein, the micro display panel 10 further comprise an integrated circuit module 17, and the integrated circuit module 17 is disposed on the package layer 15.

Wherein, the micro display panel 10 further comprise a printed circuit board 18, and the printed circuit board 18 is connected to a terminal of the package layer 15 away from the second terminal 11d.

The micro display panel 10 in the embodiment of the present disclosure comprises the glass substrate 11, the insulation layer 12, the thin film transistor layer 13, and the micro light-emitting diode layer. The glass substrate 11 comprises the first surface 11a and the second surface 11b arranged opposite to one another, and the first terminal 11c and the second terminal 11d arranged opposite to one another. The insulation layer 12 is disposed on the first surface 11a. The thin film transistor layer 13 is disposed on the surface of the insulation layer 12 away from the glass substrate 11. The micro light-emitting diode layer 14 is disposed on the surface of the thin film transistor layer 13 away from the insulation layer 12. Wherein, the terminal of the insulation layer 12, the thin film transistor layer 13, and the micro light-emitting diode layer close to the first terminal 11c is bent toward the side away from the second surface 11b, and the interval is defined between the terminal of the insulation layer 12 close to the first terminal 11c and the first terminal 11c. In the present disclosure, the micro light-emitting diode layer 14 is disposed on the surface of the thin film transistor layer 13 away from the insulation layer 12, so that bottom emission of the micro display panel 10 can be realized. Since the terminal of the insulation layer 12, the thin film transistor layer 13, and the micro light-emitting diode layer close to the first terminal 11c is bent at a fan-out region toward the side away from the second surface 11b, the interval is defined between the terminal of the insulation layer 12 close to the first terminal 11c and the first terminal 11c. Therefore, when the micro display panel 10 is spliced with the micro display panel 10, the insulating layer 12, the thin film transistor layer 13, and the micro light-emitting diode layer are not squeezed, which prevents the insulation layer 12 from damage during a bending process. At the same time, a smaller interval occurs in adoption of such method a during an assembly process.

Figure 2:
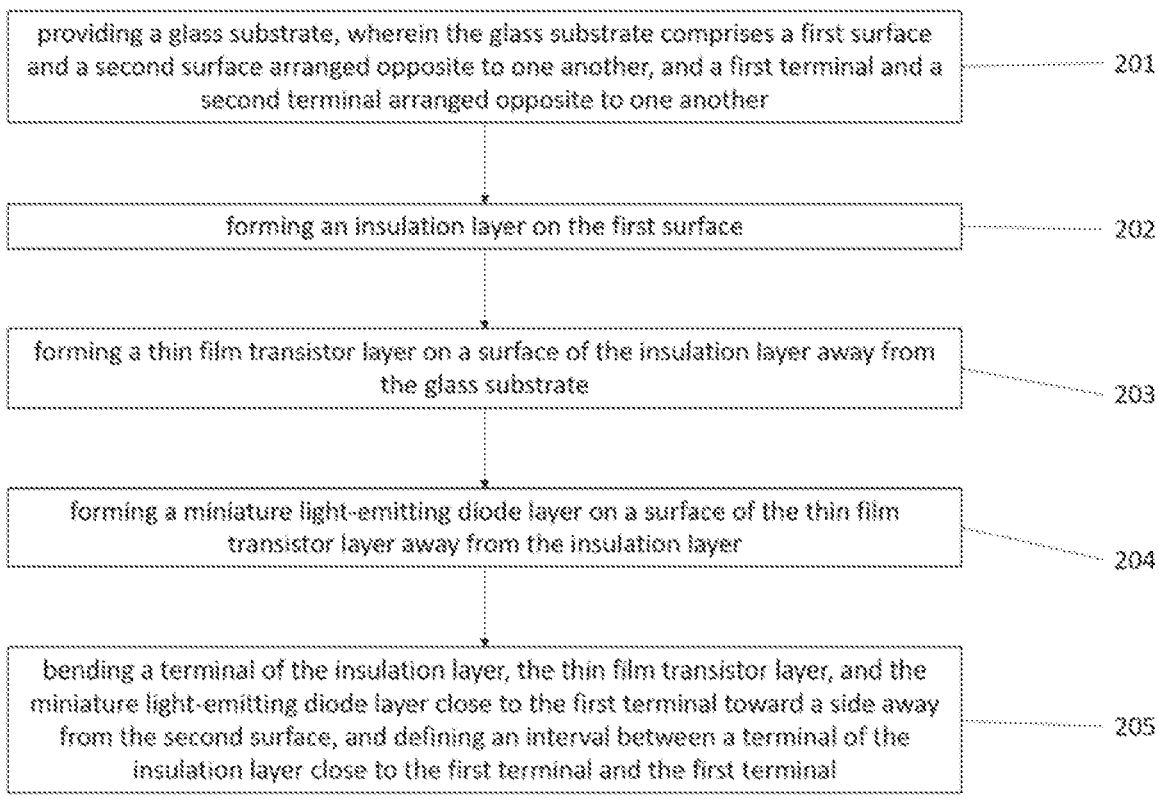
FIG. 2 is a flowchart of a manufacturing method of the micro display panel provided by the embodiment of the present disclosure.

Refer to FIG. 2, FIG. 2 is a flowchart of a manufacturing method of the micro display panel provided by the embodiment of the present disclosure. Wherein, the manufacturing method of the micro display panel provided by the embodiment of the present disclosure comprises following steps:

Step 201: providing a glass substrate, wherein the glass substrate comprises a first surface and a second surface arranged opposite to one another, and a first terminal and a second terminal arranged opposite to one another.

It should be noted that the first surface may be an upper surface of the glass substrate, and the second surface may be a lower surface of the glass substrate. Moreover, the first surface may be the lower surface of the glass substrate, and the second surface may be the upper surface of the glass substrate. In the embodiment of the present disclosure without special instructions, the first surface is assumed to be the upper surface of the glass substrate and the second surface is assumed to be the lower surface of the glass substrate. The first terminal is a right terminal of the glass substrate and the second terminal is a left terminal of the glass substrate. Moreover, in some embodiments, orientations of the first terminal and the second terminal may be interchanged. In the embodiment of the present disclosure without special instructions, the first terminal is assumed to be the right terminal of the glass substrate 11 and the second terminal is assumed to be the left terminal of the glass substrate.

Step 202: forming an insulation layer on the first surface.

It should be noted that the insulation layer is a polyimide film, and the insulation layer may be made of other materials. In the present embodiment, the materials used for the insulation layer are not repeated.

Step 203: forming a thin film transistor layer on a surface of the insulation layer away from the glass substrate.

It should be noted that the thin film transistor layer is a switch of the micro display panel. The thin film transistor drives each liquid crystal pixel on the micro display panel.

Step 204: forming a micro light-emitting diode layer on a surface of the thin film transistor layer away from the insulation layer.

It should be noted that the micro light-emitting diode layer comprises a plurality of micro light-emitting diodes. Specifically, the plurality of the micro light-emitting diodes can be arranged in an array to form a micro light-emitting diode layer.

Step 205: bending a terminal of the insulation layer, the thin film transistor layer, and the micro light-emitting diode layer close to the first terminal toward a side away from the second surface, and defining an interval between a terminal of the insulation layer close to the first terminal and the first terminal.

Due to adoption of such method, when the micro display panel is spliced with the micro display panel, the insulating layer, the thin film transistor layer, and the micro light-emitting diode layer are not squeezed, which prevents the insulation layer from damage during a bending process. At the same time, a less interval occurs in adoption of such method a during an assembly process.

Figure 3:
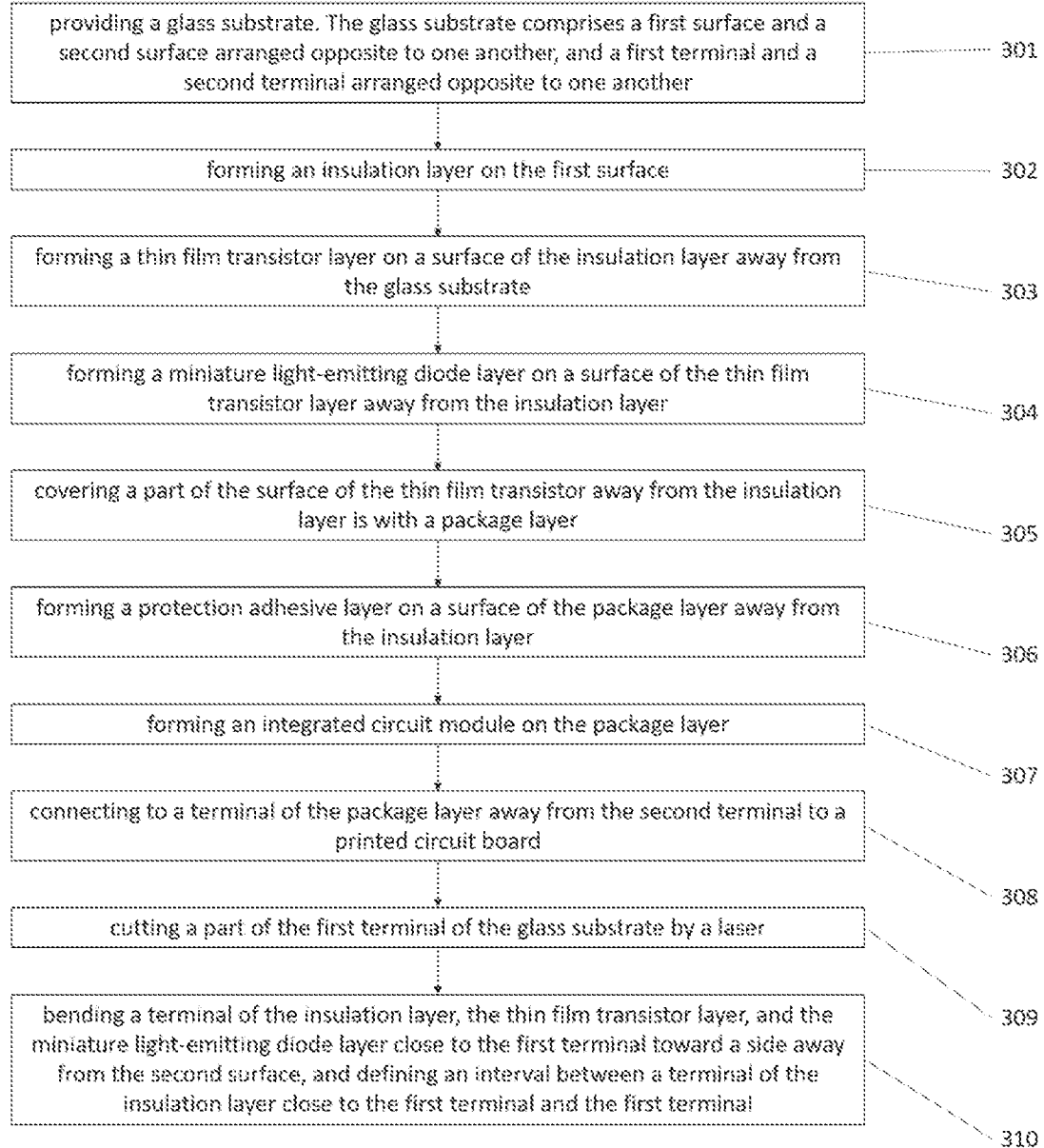
FIG. 3 is a flowchart of another manufacturing method of the micro display panel provided by the embodiment of the present disclosure.
Figure 4:
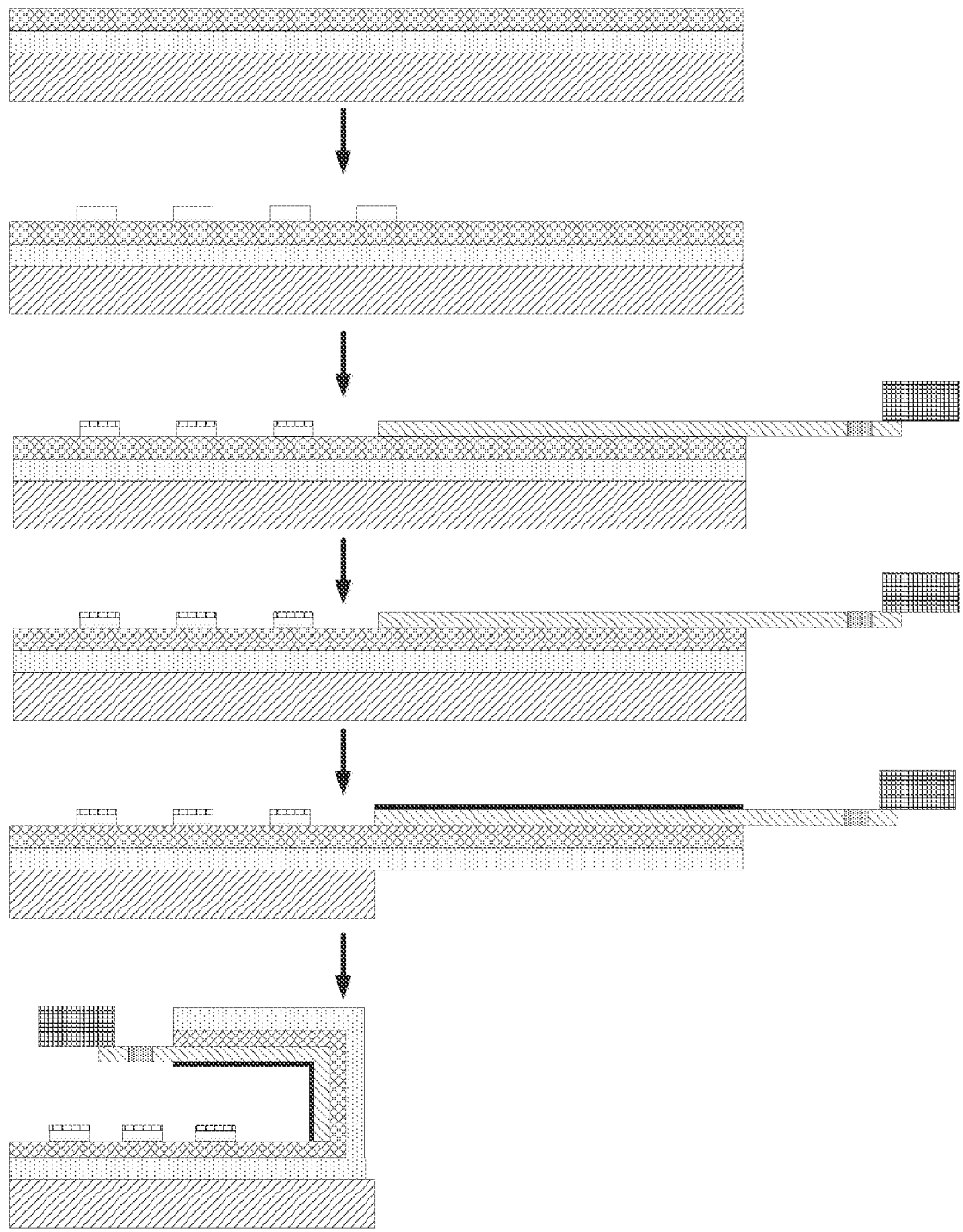
FIG. 4 is a schematic scene diagram of another manufacturing method of the micro display panel provided by the embodiment of the present disclosure.

Refer to FIG. 3 and FIG. 4, FIG. 3 is a flowchart of another manufacturing method of the micro display panel provided by the embodiment of the present disclosure. FIG. 4 is a schematic scene diagram of another manufacturing method of the micro display panel provided by the embodiment of the present disclosure.

Wherein, the manufacturing method of the micro display panel provided by the embodiment of the present disclosure comprises following steps:

Step 301: providing a glass substrate. The glass substrate comprises a first surface and a second surface arranged opposite to one another, and a first terminal and a second terminal arranged opposite to one another.

Step 302: forming an insulation layer on the first surface.

Step 303: forming a thin film transistor layer on a surface of the insulation layer away from the glass substrate.

Step 304: forming a micro light-emitting diode layer on a surface of the thin film transistor layer away from the insulation layer.

Step 305: covering a part of the surface of the thin film transistor away from the insulation layer is with a package layer.

Step 306: forming a protection adhesive layer on a surface of the package layer away from the insulation layer.

It should be noted that the protection adhesive layer may be a black adhesive layer or a transparent adhesive layer. Moreover, the protection adhesive layer may also be other adhesive layers. It can be understood that the protection adhesive layer can protect the package layer from being damaged by scratches, thereby increasing lifespan of the micro display panel.

Step 307: forming an integrated circuit module on the package layer.

Step 308: connecting to a terminal of the package layer away from the second terminal to a printed circuit board.

Step 309: cutting a part of the first terminal of the glass substrate by a laser.

It should be noted that, in addition to cutting a part of the glass substrate with a laser, other cutting methods can also be used, such as cutting with a water jet. Moreover, a cut-out part of the glass substrate corresponds to a fan-out region.

Step 310: bending a terminal of the insulation layer, the thin film transistor layer, and the micro light-emitting diode layer close to the first terminal toward a side away from the second surface, and defining an interval between a terminal of the insulation layer close to the first terminal and the first terminal.

Due to adoption of such method, when the micro display panel is spliced with the micro display panel, the insulating layer, the thin film transistor layer, and the micro light-emitting diode layer are not squeezed, which prevents the insulation layer from damage during a bending process. At the same time, a less interval occurs in adoption of such method a during an assembly process.

Figure 5:
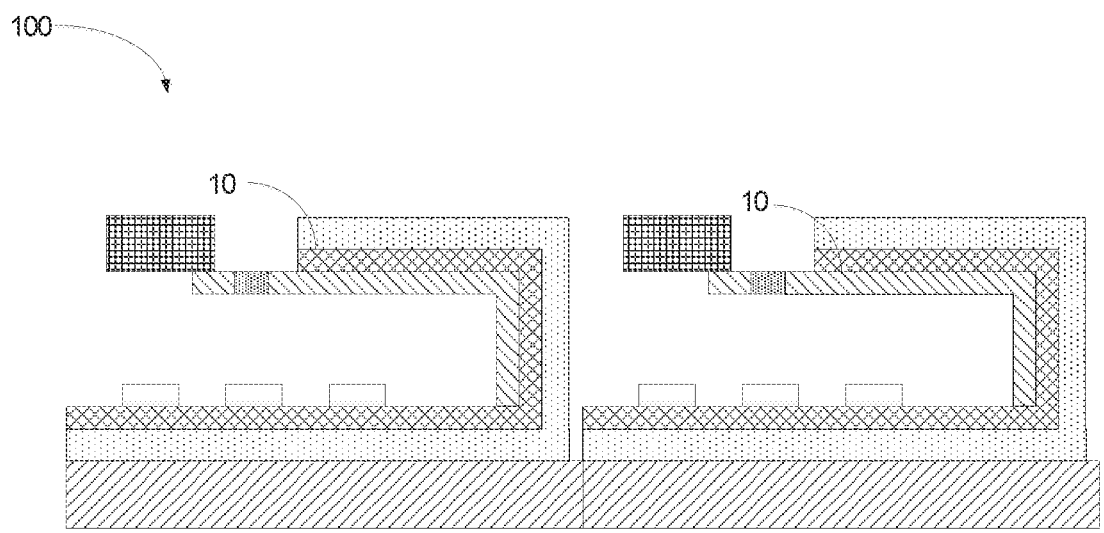
FIG. 5 is a schematic structural diagram of a spliced display panel provided by the embodiment of the present disclosure.

Refer to FIG. 5, FIG. 5 is a schematic structural diagram of a spliced display panel provided by the embodiment of the present disclosure. The embodiment of the present disclosure provides a spliced display panel 100, wherein the spliced display panel 100 comprises a plurality of micro display panels 10, and the plurality of the micro display panels are tightly spliced. The micro display panel 10 is the micro display panel 10 described in the above embodiments. Since the micro display panel 10 has been described in detail in the above embodiments, the micro display panel 10 is not described in detail in the embodiments of the present disclosure.

The spliced display panel 100 in the embodiment of the present disclosure is formed by splicing a plurality of micro display panels 10. When the micro display panel 10 is spliced with the micro display panel 10, the insulating layer 12, the thin film transistor layer 13, and the micro light-emitting diode layer are not squeezed, which prevents the insulation layer 12 from damage during a bending process. At the same time, a less interval occurs in adoption of such method a during an assembly process.

The micro display panel, the manufacturing method thereof, and the spliced display panel provided by the embodiments of the present disclosure have been described in detail above. Specific examples are used herein to explain principles and implementations of the present disclosure. The descriptions of the above embodiments are only used to help understand the present disclosure. At the same time, for those skilled in the art, according to ideas of the present disclosure, there will be changes in the specific implementation and application scope. In summary, the content of the present specification should not be construed as a limitation on the present disclosure.

What is claimed is:

1. A micro display panel, comprising:
    a glass substrate, wherein the glass substrate comprises a first surface and a second surface arranged opposite to one another, and a first end and a second end arranged opposite to one another;
    an insulation layer disposed on the first surface;
    a thin film transistor layer disposed on a surface of the insulation layer away from the glass substrate; and a micro light-emitting diode layer disposed on a surface of the thin film transistor layer away from the insulation layer;

wherein an end of the insulation layer, an end of the thin film transistor layer, and an end of the micro light-emitting diode layer that are close to the first end are bent away from the second surface, so that the insulation layer has a side surface close to the first end and the side surface is recessed toward the second end with respect to the first end.

2. The micro display panel as claimed in claim 1, further comprising a package layer partially covering a surface of the thin film transistor away from the insulation layer.

3. The micro display panel as claimed in claim 2, further comprising a protection adhesive layer disposed on a surface of the package layer away from the insulation layer.

4. The micro display panel as claimed in claim 2, further comprising an integrated circuit module, disposed on the package layer.

5. The micro display panel as claimed in claim 2, further comprising a printed circuit board connected to a end of the package layer away from the second end.

6. A manufacturing method of a micro display panel, comprising:

providing a glass substrate, glass substrate comprises a first surface and a second surface arranged opposite to one another, and a first end and a second end arranged opposite to one another;

forming an insulation layer on the first surface;

forming a thin film transistor layer on a surface of the insulation layer away from the glass substrate;

forming a micro light-emitting diode layer on a surface of the thin film transistor layer away from the insulation layer; and bending an end of the insulation layer, an end of the thin film transistor layer, and an end of the micro light-emitting diode layer that are close to the first end away from the second surface, so that the insulation layer has a side surface close to the first end and the side surface is recessed toward the second end with respect to the first end.

7. The manufacturing method of the micro display panel as claimed in claim 6, further comprising: after forming the micro light-emitting diode layer on the surface of the thin film transistor layer away from the insulation layer, cutting a part of the first end of the glass substrate by a laser.

8. The manufacturing method of the micro display panel as claimed in claim 6, further comprising: after forming the thin film transistor layer on the surface of the insulation layer away from the glass substrate, covering a part of a surface of the thin film transistor away from the insulation layer with a package layer.

9. The manufacturing method of the micro display panel as claimed in claim 8, further comprising: after covering the part of the surface of the thin film transistor away from the insulation layer with the package layer, forming a protection adhesive layer on a surface of the package layer away from the insulation layer.

10. The manufacturing method of the micro display panel as claimed in claim 8, further comprising: after covering the part of the surface of the thin film transistor away from the insulation layer with the package layer, forming an integrated circuit module on the package layer.

11. A spliced display panel, comprising a plurality of micro display panels, plurality of the micro display panels are spliced, and each of the micro display panels comprises:

a glass substrate, glass substrate comprises a first surface and a second surface arranged opposite to one another, and a first end and a second end arranged opposite to one another;

an insulation layer disposed on the first surface;

a thin film transistor layer disposed on a surface of the insulation layer away from the glass substrate; and a micro light-emitting diode layer disposed on a surface of the thin film transistor layer away from the insulation layer;

wherein an end of the insulation layer, an end of the thin film transistor layer, and an end of the micro light-emitting diode layer that are close to the first end are bent away from the second surface, so that the insulation layer has a side surface close to the first end and the side surface is recessed toward the second end with respect to the first end.

12. The spliced display panel as claimed in claim 11, wherein the each of the micro display panels further comprises a package layer partially covering a surface of the thin film transistor away from the insulation layer.

13. The spliced display panel as claimed in claim 12, wherein the each of the micro display panels further comprises a protection adhesive layer, and the protection adhesive layer is disposed on a surface of the package layer away from the insulation layer.

14. The spliced display panel as claimed in claim 12, wherein the each of the micro display panels further comprises an integrated circuit module, and the integrated circuit module is disposed on the package layer.

15. The spliced display panel as claimed in claim 12, wherein the each of the micro display panels further comprises a printed circuit board, and the printed circuit board is connected to a end of the package layer away from the second end.

* * * * *